(12) United States Patent
Liaw

(10) Patent No.: US 7,316,979 B2
(45) Date of Patent: Jan. 8, 2008

(54) METHOD AND APPARATUS FOR PROVIDING AN INTEGRATED ACTIVE REGION ON SILICON-ON-INSULATOR DEVICES

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 222 days.

(21) Appl. No.: 10/632,570

(22) Filed: Aug. 1, 2003

(65) Prior Publication Data
US 2005/0026429 A1 Feb. 3, 2005

(51) Int. Cl.
*H01L 21/302* (2006.01)

(52) U.S. Cl. ............... 438/718; 438/404; 438/410; 438/706

(58) Field of Classification Search ........... 438/706, 438/710, 700, 404, 410, 412, 424, 431, 4, 438/718, 426
See application file for complete search history.

(56) References Cited

U.S. PATENT DOCUMENTS

| | | | |
|---|---|---|---|
| 6,486,038 B1 * | 11/2002 | Maszara et al. | 438/424 |
| 6,642,124 B1 * | 11/2003 | Yamauchi | 438/425 |
| 6,864,152 B1 * | 3/2005 | Mirbedini et al. | 438/427 |
| 6,879,001 B2 * | 4/2005 | Yagishita et al. | 257/347 |
| 2002/0022308 A1 * | 2/2002 | Ahn et al. | 438/164 |
| 2002/0090763 A1 * | 7/2002 | Tseng | 438/149 |
| 2003/0203285 A1 * | 10/2003 | Chung et al. | 430/5 |

\* cited by examiner

*Primary Examiner*—Lan Vinh
(74) *Attorney, Agent, or Firm*—Slater & Matsil, L.L.P.

(57) ABSTRACT

A method and apparatus for providing integrated active regions on silicon-on-insulator (SOI) devices by oxidizing a portion of the active layer. When the active layer of the SOI wafer is relatively thick, such as about 200 Å to 1000 Å or greater, the etching process partially removes the active layer. The remaining active layer is oxidized prior to a wet dip for removing the mask layer, preventing the wet dip process from undercutting the active region. When the active layer of the SOI wafer is relatively thin, such as about 25 Å to 400 Å, the partial etching step may be reduced or eliminated. In this case, the active layer is oxidized with little or no etching of the active layer. The exposed active layer is oxidized to prevent the wet dip process from undercutting the active region.

36 Claims, 4 Drawing Sheets

METHOD AND APPARATUS FOR PROVIDING AN INTEGRATED ACTIVE REGION ON SILICON-ON-INSULATOR DEVICES

TECHNICAL FIELD

The present invention relates to semiconductor manufacturing processes and, in particular, to a method for providing an integrated active region on silicon-on-insulator devices.

BACKGROUND

Silicon wafers are commonly utilized for fabricating semiconductor devices. The silicon wafers provide a semiconductor material upon which transistors and other semiconductor devices may be fabricated. Silicon wafers, however, are known to include silicon dioxide ($SiO_2$) precipitates, crystalline originated particles (COPs), polishing defects, and vacancy defects at or near the wafer surface. As a result, silicon-on-insulator (SOI) technology has been developed to eliminate or reduce these defects. Additionally, SOI devices are able to obtain higher processing speeds and lower power consumptions. SOI devices also allow better well isolation and tighter, smaller design rules, particularly for 90 nm and below designs.

Traditional SOI integrated circuits are formed on SOI substrates. A cross-section of SOI substrate 100 is illustrated in FIG. 1a. SOI substrates typically have an active layer 110, generally formed of a thin epitaxial layer of silicon, silicon-germanium oxide, germanium, strained silicon, or the like, disposed on an insulator layer 112, such as a buried oxide (BOX) layer. The insulator layer 112 is provided on a substrate 114, typically a silicon or glass substrate. The insulator layer 112 is comprised of an insulator such as silicon dioxide, which electrically isolates the active layer 110 from the substrate 114.

FIGS. 1b-1e illustrate one example of conventional processing used to create active regions on the SOI. Generally, in an SOI chip the SOI substrate 100 is processed to form a plurality of active regions (shown in FIG. 1d) in the active layer 110. Active devices such as transistors and diodes may be formed in the active regions. Active devices in the active regions are isolated from the substrate 114 by the insulator layer 112.

FIG. 1b illustrates deposition of a hard mask 116, such as a layer of silicon dioxide ($SiO_2$) and silicon nitride ($Si_3N_4$), upon the active layer 110. The hard mask 116 allows the formation and definition of active regions upon the insulator layer 112. In FIG. 1c, a photoresist layer 118 has been applied, exposed, and developed upon the hard mask 116. The photoresist layer 118 defines the active regions or patterns of the underlying material, i.e., the hard mask 116 and the active layer 110 in this case, that are to remain after the etching process.

FIG. 1d illustrates the resulting configuration after an etching process has been performed. A plurality of active regions 120 represent the remaining portions of the active layer 110 (see FIGS. 1a-1c) that were not etched away as part of the etching process and will be utilized to create SOI devices.

FIG. 1e illustrates the result of a wet dip process that removes the hard mask 116. Frequently, however, the wet dip process results in an undercut region 122 below the edges of the active region 120 in the insulator layer and may induce silicon defects on the sidewalls of the active region 120.

Subsequent processing steps frequently include the application of a conductive layer, such as a polysilicon or silicide, for forming transistors and the like. During the deposition of the conductive layer and subsequent patterning and etching, residue of the conductive layer typically remains in the undercut regions 122. Depositions of polysilicon or silicide in the undercut region are undesirable. In particular, the depositions of polysilicon or silicide can create a leakage path between gate-to-gate, active area-to-active area, contact-to-contact, and contact-to-active area.

Therefore, there is a need for a process to fabricate semiconductor devices, particularly semiconductor devices formed on SOI wafers, to eliminate or reduce the leakage path between gate-to-gate, active area-to-active area, contact-to-contact, and contact-to-active area and the Si defect on the sidewall of the active region.

SUMMARY OF THE INVENTION

The problems and needs outlined above are addressed by embodiments of the present invention. In accordance with one aspect of the present invention, a method of forming a barrier layer is provided. The method includes applying a mask on the active layer of a silicon-on-insulator (SOI) wafer, the mask defining active layers and inactive layers. The inactive areas of the active layer are partially etched, i.e., the active layer is not etched through to the insulator of the SOI wafer. The remaining portions of the active layer are oxidized, preventing or reducing the undercutting caused by a subsequent wet dip.

In another embodiment of the present invention, a mask is applied on the active layer of a silicon-on-insulator (SOI) wafer, the mask defining active layers and inactive layers. The inactive areas of the mask layer are etched to expose the inactive areas of the active layer. The exposed areas of the active layer are oxidized, preventing or reducing the undercutting caused by a wet dip.

BRIEF DESCRIPTION OF THE DRAWINGS

The above features of the present invention will be more clearly understood from consideration of the following descriptions in connection with accompanying drawings in which.

DETAILED DESCRIPTION OF PREFERRED EMBODIMENTS

Figure 1A:
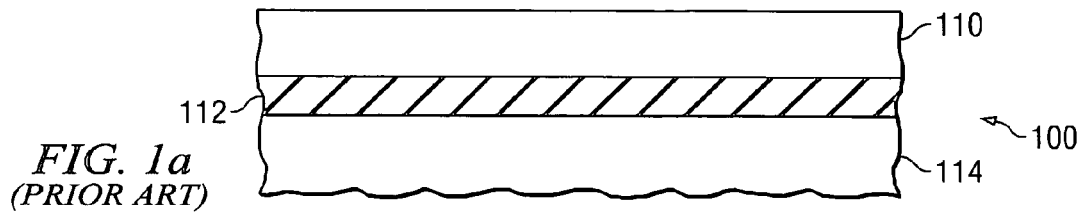
FIGS. 1a-1e are cross-section side views illustrating a conventional process of creating integrated active regions on silicon-on-insulator devices.
Figure 1B:
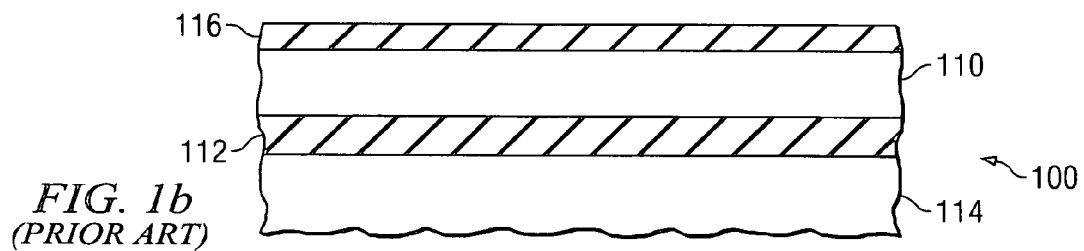
Figure 1C:
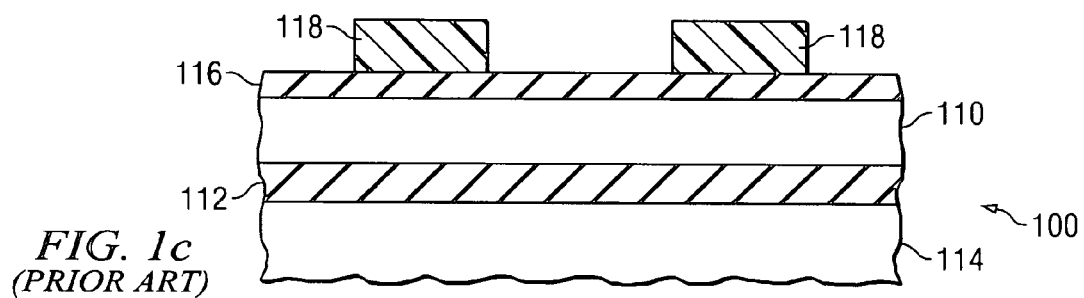
Figure 1D:
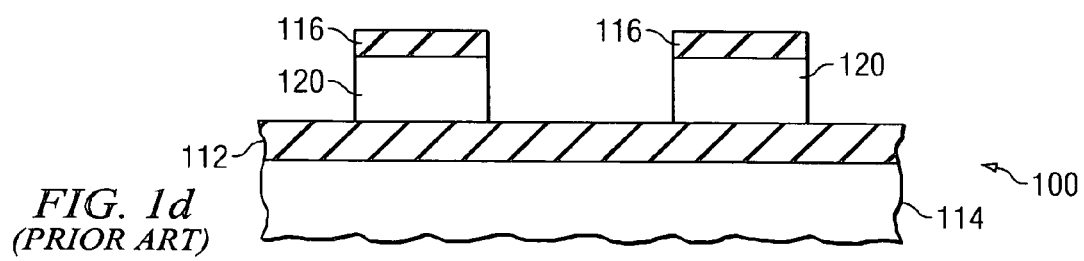
Figure 1E:
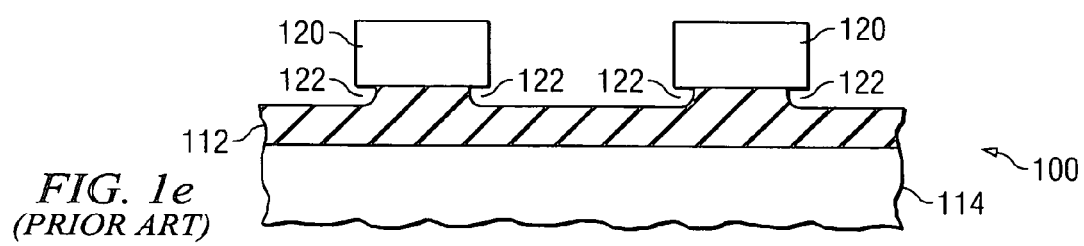

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

According to the preferred embodiment of the present invention, an oxidation step is utilized prior to performing a wet dip, thereby eliminating or reducing an undercut profile that often results from the wet dip. By preventing or reducing the undercut profile, the preferred embodiment of the present invention eliminates or reduces a leakage path between gate-to-gate, active area-to-active area, contact-to-contact, and contact-to-active area and eliminates or reduces silicon defects on the sidewalls of the active region.

Referring now to the drawings, wherein like reference numbers are used herein to designate like elements throughout the various views, preferred embodiments of the present invention are illustrated and described. As will be understood by one of ordinary skill in the art, the figures are not necessarily drawn to scale, and in some instances the drawings have been exaggerated and/or simplified in places for illustrative purposes only. One of ordinary skill in the art will appreciate the many applications and variations of the present invention in light of the following description for preferred embodiments of the present invention. The preferred embodiments discussed herein are just a few illustrative examples of the present invention and do not necessarily limit the scope of the invention to the preferred embodiments described.

Figure 2A:
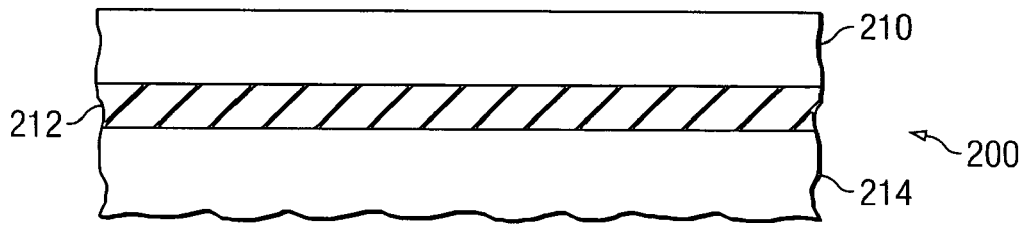
FIGS. 2a-2f are cross-section side views illustrating a process of creating integrated active regions on silicon-on-insulator devices in accordance with a first embodiment of the present invention.

FIGS. 2a-2f are cross-section side views illustrating the formation of an SOI after various process steps in accordance with a first embodiment of the present invention. FIG. 2a illustrates a cross-section view of an SOI wafer. An SOI wafer typically has an active layer 210 and a substrate 214 separated by an insulator layer 212. Typically, the insulator layer 212 is a buried oxide (BOX) layer, such as silicon dioxide formed by oxidizing the silicon substrate. The insulator layer 212 serves to electrically isolate the active layer 210 from the substrate 214. The active layer 210 is generally a semiconductor material such as silicon, germanium, silicon germanium, strained silicon, or the like, having a thickness of approximately 200 Å to 1000 Å. The substrate 214 is preferably a silicon substrate, which is typically undoped, but may be lightly doped. Other materials, such as germanium, quartz, sapphire, and glass could alternatively be used for the substrate 214. The creation of an SOI wafer is considered well known in the art and will not be discussed in greater detail, except to the extent necessary to understand the present invention.

Figure 2B:
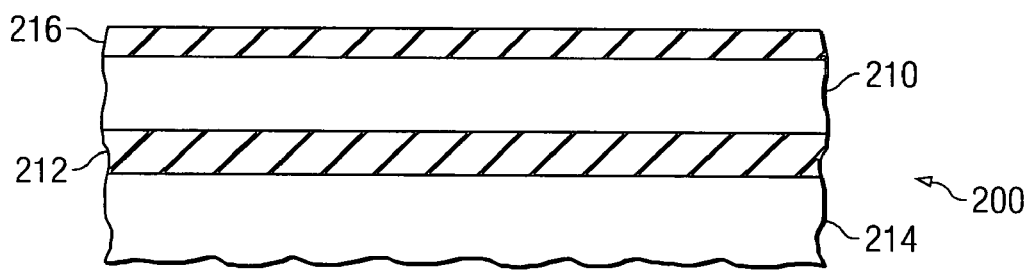

FIG. 2b is a cross-section view of the SOI wafer illustrated in FIG. 2a after a hard mask 216 has been applied on the active layer 210 as is well-known in the art. The hard mask 216 provides a protective barrier for the active layer 210 during the etching process discussed below with reference to FIG. 2d. Generally, the hard mask 216 will be patterned, and an etching step will occur. During the etching steps, the hard mask 216 protects the underlying active area.

Preferably, the hard mask 216 comprises one or more layers of an oxide, $Si_3N_4$, SiON, high-K dielectric (preferably greater than 5), a combination thereof, or the like. In one embodiment, for example, the hard mask 216 comprises a layer of $SiO_2$ approximately 10 Å to 200 Å in thickness and a layer of $Si_3N_4$ approximately 20 Å to 1000 Å in thickness.

Figure 2C:
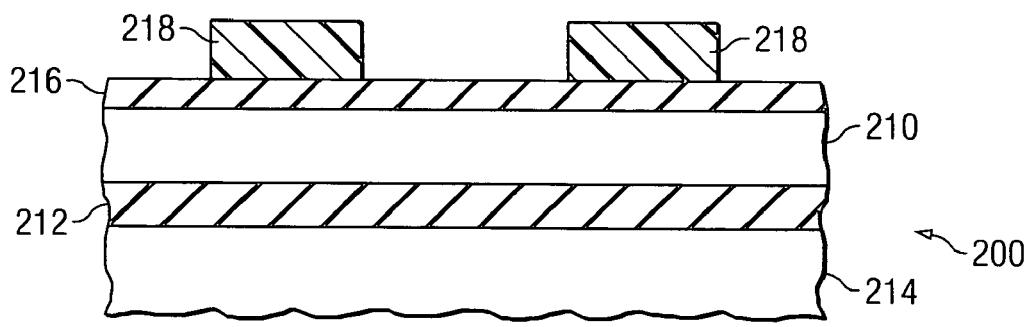

FIG. 2c is a cross-section view of the SOI wafer 200 from FIG. 2b after a photoresist layer 218 has been applied, exposed, and developed upon the hard mask 216. The photoresist layer 218 defines active and inactive regions. The active regions are the regions beneath the photoresist layer 218 that will remain after an etching step is performed, and the inactive regions are the regions that will be removed during the etching process. Accordingly, the photoresist layer 218 of FIG. 2c remains where the active regions will be located. The areas of the hard mask 216 and the active layer 210 that are not located beneath the photoresist layer 218 are considered the inactive regions and will be etched during the etching process.

Figure 2D:
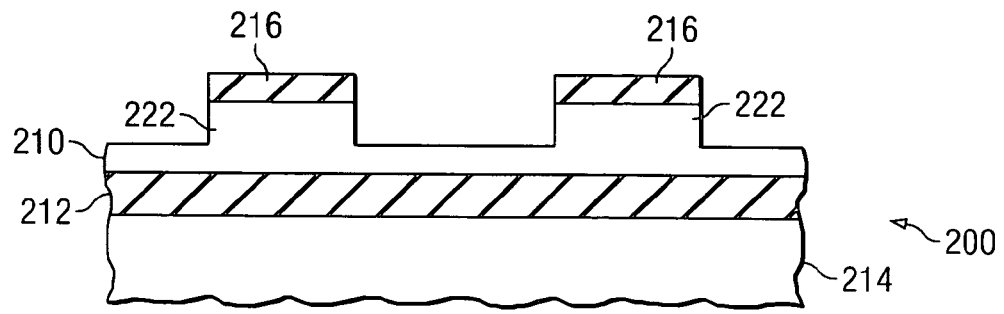

FIG. 2d illustrates the resulting configuration after an etching process has been performed on the SOI wafer 200 illustrated in FIG. 2c and the photoresist layer 218 has been removed. In this first embodiment of the present invention, the active layer 210 is partially etched, i.e., the active layer 210 is not etched completely through to the insulator layer 212. Preferably, the active layer 210 is partially etched such that about 25 Å to 400 Å of the active layer 210 remains. The remaining portions of the active layer 210 located beneath the remaining portions of the hard mask 216, i.e., active regions 222, are the active regions of the device being formed.

Figure 2E:
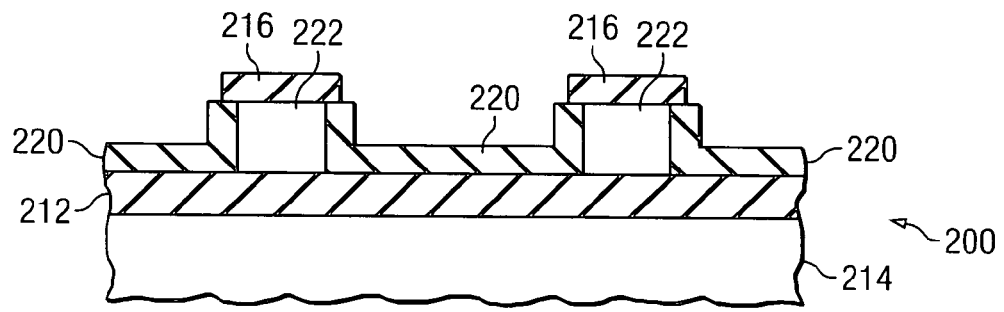

FIG. 2e illustrates the SOI wafer 200 illustrated in FIG. 2d after an oxidation and anneal step has been performed. In the preferred embodiment wherein the active layer (FIG. 2d) comprises Si, the oxidized regions 220 comprise $SiO_2$. The oxidized regions 220 are generally formed on the insulator layer 212 and along the sidewalls of active regions 222. The oxidized regions 220 form a protective barrier layer on top of the insulator layer 212 and along the sidewalls of the active regions 222 during succeeding steps.

Oxidation may be performed by any oxidation process, such as wet or dry thermal oxidation, in a single step or multiple steps (i.e., oxidizing and annealing). Preferably, however, a dry oxidation step, such as a furnace anneal, a rapid thermal anneal (RTA), or the like, is performed. Most preferably, a furnace anneal is performed at a temperature of approximately 500° to 1250° C., but most preferably about 700° C. to 1200° C., with an ambient comprising an oxide, $H_2O$, NO, a combination thereof, a combination thereof with a nitrogen content, or the like, for about 5 to about 180 minutes, but most preferably about 10 to about 120 minutes. Preferably, the oxidized region 220 is approximately 25 Å to 800 Å.

Preferably, an optional nitridation step is performed following the oxidation step. The nitridation step may be performed, for example, by a thermal anneal (e.g., thermal anneal or a rapid thermal anneal (RTA)) in a nitrogen ambient or a decoupled plasma nitridation (DPN) process. Preferably, if a nitridation step is performed, the oxidation step is performed by a furnace process at a temperature of approximately 500° to 1250° C., but most preferably about 700° C. to 1200° C., with an ambient comprising an oxide, $H_2O$, NO, a combination thereof, a combination thereof with a nitrogen content, or the like, for about 5 to about 180 minutes, but most preferably about 10 to about 120 minutes. In the preferred embodiments, an oxidation step is performed by a furnace anneal or an RTA with an oxygen-containing ambient followed by a nitridation step performed by a furnace anneal or an RTA with a nitrogen-containing ambient, but most preferably, both processes are performed by a furnace process.

Figure 2F:
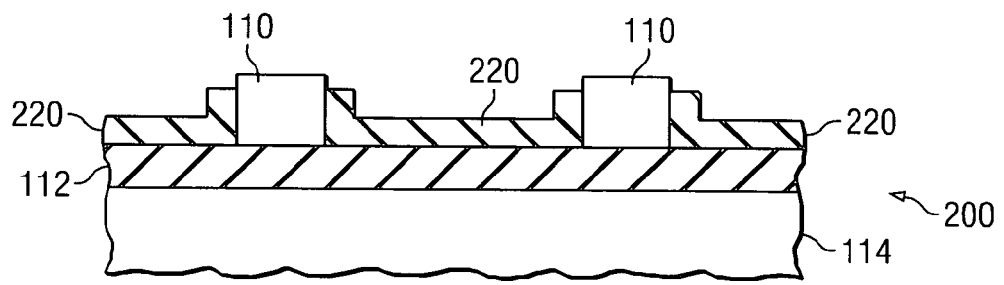

FIG. 2f illustrates the SOI wafer illustrated in FIG. 2e after a wet dip step is performed for removing the remaining portions of the hard mask 216. A wet dip that is commonly used is dilute hydrofluoric acid. Dilute hydrofluoric acid may, for example, be formed by a mixture of 1 part of concentrated (49%) hydrofluoric (HF) acid and 25 parts of water ($H_2O$). This mixture is commonly known as 25:1 HF. Another commonly used wafer cleaning solution is a mixture of concentrated sulphuric acid and hydrogen peroxide, commonly referred to as piranha solution. A phosphoric acid solution of phosphoric acid ($H_3PO_4$) and water ($H_2O$) may also be used to remove the hard mask 216.

Furthermore, the oxidized regions 220 may be partially or entirely removed during the wet dip step to remove the hard mask 216 or subsequent processing steps, such as wafer cleaning and the like.

Thereafter, the SOI wafer is prepared in accordance with other standard SOI processes, such as anneal, sacrifice oxide, substrate doping, gate oxide and poly layer, and the like, that is commonly known in the art.

Figure 3A:
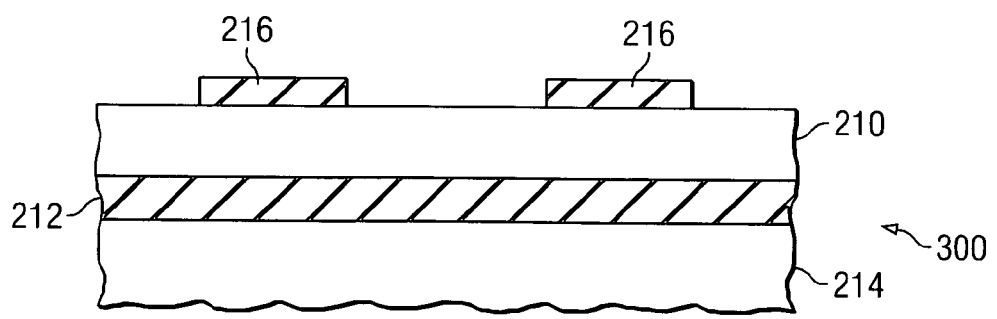
FIGS. 3a-3c are cross-section side views illustrating a process of creating integrated active regions on silicon-on-insulator devices in accordance with a second embodiment of the present invention.
Figure 3B:
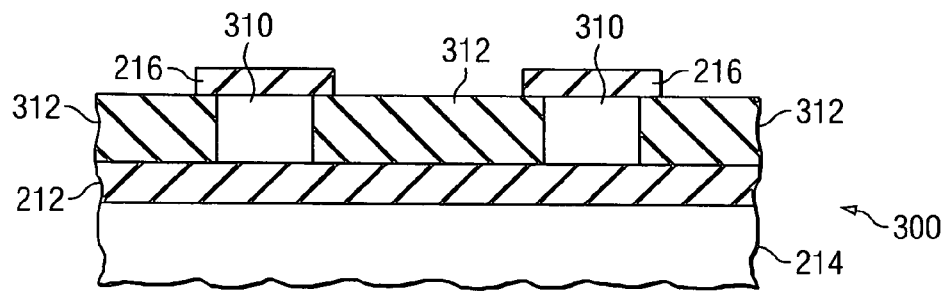
Figure 3C:
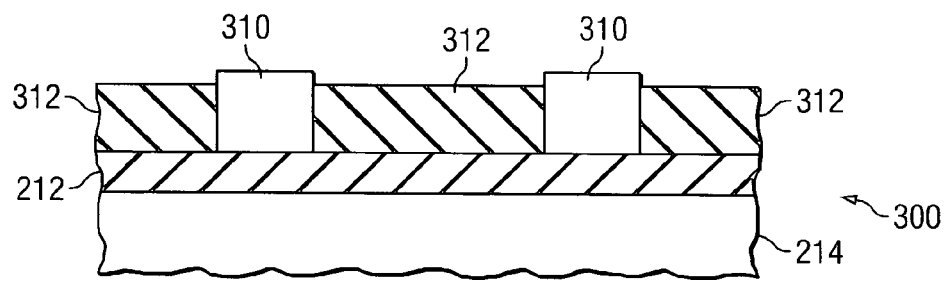

FIGS. 3a-3c are cross-section side views illustrating the formation of an SOI wafer after various process steps in accordance with a second embodiment of the present invention. Whereas the first embodiment of the present invention is particularly useful when the thickness of the active layer of the SOI wafer is about 200 Å to 1000 Å and greater, the second embodiment is particularly useful when the thickness of the active layer of the SOI wafer is about 25 Å to 400 Å. As an initial matter, it is noted that the process steps depicted in FIGS. 3a-3c assume a starting SOI wafer in accordance with the SOI wafer described above with reference to FIG. 2c, except that the active layer 210 of FIG. 2c, has a preferred thickness of about 25 Å to 400 Å.

Accordingly, FIG. 3a illustrates a cross-section view of an SOI wafer 300 with a hard mask 216 applied, patterned, and etched. One method of applying, patterning, and etching a hard mask is discussed above with reference to FIG. 2c. The regions of the active layer 210 below the remaining hard mask 216 will become the active regions of the SOI device. In accordance with the second embodiment, the active layer 210 is minimally etched.

FIG. 3b illustrates the SOI wafer 300 illustrated in FIG. 3a after an oxidation step has been performed in accordance with the second embodiment of the present invention. The oxidation of the exposed portions of the active layer 210 (FIG. 3a) creates an oxidized region 312 wherein the entire exposed portions of the active layer 210 is preferably consumed and converted to an oxide. In the preferred embodiment wherein the active layer 210 (FIG. 3a) comprises Si, the oxidized region 312 comprises $SiO_2$. The oxidized region 312 is generally formed on the insulator layer 212 surrounding the active regions 310. The oxidized regions 312 create a barrier layer on top of the insulator layer 212 and along the sidewalls of active regions 310, protecting the insulator layer 212 and the sidewalls of the active regions 310 from subsequent processing steps.

Oxidation may be performed by any oxidation process, such as wet or dry thermal oxidation, in a single step or multiple steps (i.e., oxidizing and annealing). Preferably, however, a dry oxidation step, such as a furnace anneal, a rapid thermal anneal (RTA), or the like, is performed. Most preferably, a furnace anneal is performed at a temperature of approximately 500° to 1250° C., but most preferably about 700° C. to 1200° C., with an ambient comprising an oxide, $H_2O$, NO, a combination thereof, a combination thereof with a nitrogen content, or the like, for about 5 to about 180 minutes, but most preferably about 10 to about 120 minutes. Preferably, the oxidized region 312 is approximately 25 Å to 800 Å.

Preferably, an optional nitridation step may be performed following the oxidation step. The nitridation step may be performed, for example, by a thermal anneal (e.g., thermal anneal or a rapid thermal anneal (RTA)) in a nitrogen ambient or a decoupled plasma nitridation (DPN) process. Preferably, if a nitridation step is performed, the oxidation step is performed by a furnace process at a temperature of approximately 500° to 1250° C., but most preferably about 700° C. to 1200° C., with an ambient comprising an oxide, $H_2O$, NO, a combination thereof, a combination thereof with a nitrogen content, or the like, for about 5 to about 180 minutes, but most preferably about 10 to about 120 minutes. In the preferred embodiments, an oxidation step is performed by a furnace anneal or an RTA with an oxygen-containing ambient followed by a nitridation step performed by a furnace anneal or an RTA with a nitrogen-containing ambient, but most preferably, both processes are performed by a furnace process.

FIG. 3c illustrates the SOI wafer 300 illustrated in FIG. 3b after performing a wet dip to remove the remaining portions of the hard mask 216. In the preferred embodiment, the wet dip process, such as an HF wet dip, a phosphoric acid solution of phosphoric acid ($H_3PO_4$) and water ($H_2O$), or the like, is preferred as discussed above with reference to FIG. 2f. Furthermore, the oxide regions 220 may be partially or entirely removed during the wet dip step to remove the hard mask 216 or subsequent processing steps, such as wafer cleaning and the like.

Thereafter, the SOI wafer is prepared in accordance with other standard SOI processes, such as anneal, sacrifice oxide, substrate doping, gate oxide and poly layer, and the like.

Note that in both embodiments some portion of active layer 210 beneath the pattern formed in hard mask 216 is consumed in the oxidation process. This means that the resulting active region will be slightly smaller than the pattern formed in hard mask 216. Care should be taken to design the pattern in hard mask 216 to compensate or offset this effect.

Figure 4A:
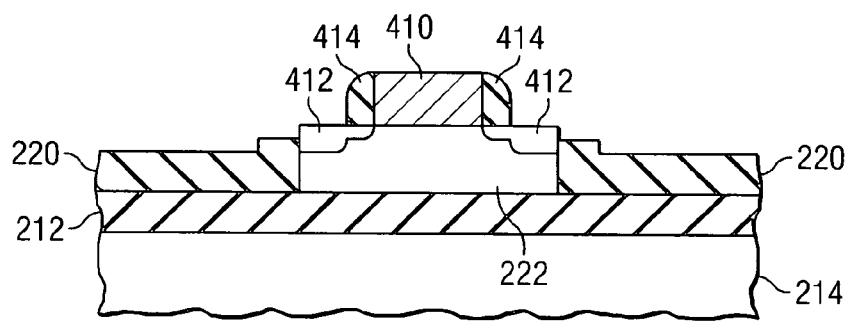
FIGS. 4a and 4b are cross-section side views illustrating a transistor embodying features of the present invention.
Figure 4B:
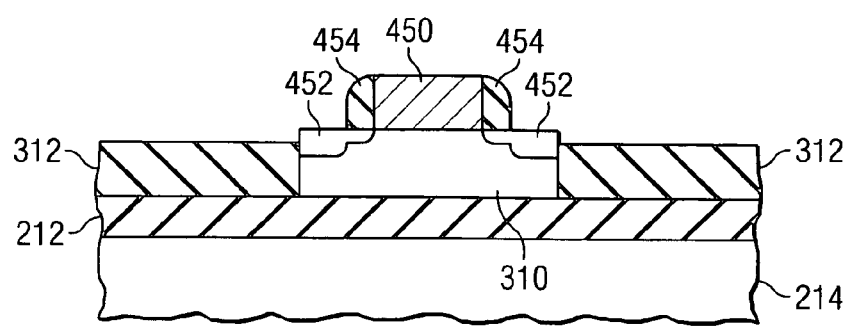

FIGS. 4a and 4b illustrate devices that may be formed in accordance with the embodiments of the present invention discussed above with reference to FIGS. 2a-2f and 3a-3c, respectively, wherein like reference numerals refer to like elements. In particular, FIG. 4a illustrates a transistor formed on an active region 222 formed in accordance with FIGS. 2a-2f. A gate structure 410 is formed on the active region 222. Active areas of the active region, e.g., the source/drain 412, are doped and an insulator material 414 is applied to the sidewalls of the gate structure 410.

Similarly, FIG. 4b illustrates a transistor formed on an active region 310 formed in accordance with FIGS. 3a-3c. A gate structure 450 is formed on the active region 310. Active areas of the active region, e.g., the source/drain 452, are doped and an insulator material 454 is applied to the sidewalls of the gate structure 450.

It will be appreciated by those skilled in the art having the benefit of this disclosure that an embodiment of the present invention provides a method for making an improved barrier layer in a via or contact opening. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of forming active regions, the method comprising the steps of:
   applying a mask layer to an active layer, the active layer being on an underlying layer;
   patterning the mask layer to define active regions and inactive regions of the active layer, the patterning using the active layer as an etch stop layer; and
   oxidizing the inactive regions of the active layer such that the oxidized inactive regions contact the underlying layer.

2. The method of claim 1 wherein the active layer is an active layer of a silicon-on-insulator wafer.

3. The method of claim 1 further comprising partially removing the active layer in the inactive regions.

4. The method of claim 1 wherein the active layer is about 200 Å to about 1000 Å in thickness and further comprising partially removing the active layer in the inactive regions.

5. The method of claim 1 wherein the mask layer is about 10 Å to about 1500 Å in thickness.

6. The method of claim 1 wherein the active layer is about 25 Å to about 400 Å in thickness and substantially all of the active layer remains in the inactive regions.

7. The method of claim 1 wherein the mask layer comprises a material selected from the group consisting of oxide, silicon dioxide, silicon nitride, silicon oxynitride, high-K dielectric, or a combination thereof.

8. The method of claim 1 further comprising removing the mask layer on the active layer after the oxidizing.

9. The method of claim 1 wherein the active layer is formed from a material selected from the group consisting of silicon, germanium, silicon-germanium, and combinations thereof.

10. The method of claim 1 wherein the step of oxidizing is performed at about 700° C. to about 1200° C.

11. The method of claim 1 wherein the step of oxidizing is performed by one or more steps of annealing by a furnace anneal or rapid thermal anneal process.

12. The method of claim 1 wherein the step of oxidizing is performed by one or more steps of annealing by a furnace anneal or rapid thermal anneal process at a temperature about 500° C. to about 1250° C.

13. The method of claim 1 wherein the step of oxidizing creates an oxidation layer about 25 Å to about 800 Å in thickness.

14. The method of claim 1 wherein the step of oxidizing is performed with an ambient content comprising $O_2$, $H_2O$, NO, or some combination thereof.

15. A method of forming an active region, the method comprising:
    applying a mask layer onto an active layer of a silicon-on-insulator (SOI) wafer, the SOI wafer having a substrate layer, the active layer and an insulator layer therebetween;
    patterning the mask layer to expose areas of the active layer;
    etching the SOI wafer such that the exposed areas of the active layer are partially removed without exposing the insulator layer, such that 25Å to 400Å of the active layer remains in the etched regions; and
    oxidizing the SOI wafer such that oxidized areas of the active layer extend through to the insulator layer.

16. The method of claim 15 wherein the step of patterning the mask layer is performed by utilizing a photoresist.

17. The method of claim 15 wherein the mask layer comprises a material selected from the group consisting of oxide, silicon dioxide, silicon nitride, silicon oxynitride, high-K dielectric, or a combination thereof.

18. The method of claim 15 wherein the mask layer comprises a silicon dioxide layer about 10 to 200 Å in thickness and a silicon nitride layer about 20 to 1000 Å in thickness.

19. The method of claim 15 wherein the step of oxidizing is performed at about 500° C. to about 1250° C.

20. The method of claim 15 wherein the step of oxidizing is performed with an ambient content comprising $O_2$, $H_2O$, NO, or some combination thereof.

21. The method of claim 20 wherein the step of oxidizing is performed by one or more steps of annealing by a furnace anneal or a rapid thermal anneal process at a temperature about 500° C. to about 1250° C.

22. The method of claim 15 further comprising removing the mask layer after oxidizing the SOI wafer, through a wet-dip process.

23. The method of claim 15 wherein the active layer is formed from a material selected from the group consisting of silicon, germanium, silicon-germanium, and combinations thereof.

24. The method of claim 15 wherein the step of etching includes removing exposed areas of the active layer such that about 25 Å to about 400 Å of the active layer remains.

25. The method of claim 15 wherein the step of oxidizing results in an oxidation layer about 25 Å to about 800 Å in thickness.

26. A method of forming active regions, the method comprising:
    applying a mask layer onto an active layer of a silicon-on-insulator (SOI) wafer, the SOI wafer having the active layer, a substrate layer, and an insulator layer between the active layer and the substrate layer;
    patterning the mask layer to identify active regions and inactive regions of the active layer using the active layer as an etch stop; and
    oxidizing the SOI wafer such that oxidized portions of the active layer in the inactive regions extend through to the insulator layer, the insulator layer not being exposed in the inactive regions.

27. The method of claim 26 wherein the step of patterning the mask layer is performed by utilizing a photoresist.

28. The method of claim 26 wherein the mask layer comprises one or more layers comprising a material selected from the group consisting of oxide, silicon dioxide, silicon nitride, silicon oxynitride, high-K dielectrics, or a combination thereof.

29. The method of claim 26 wherein the mask layer comprises a silicon dioxide layer about 10 Å to about 200 Å in thickness and a silicon nitride layer about 20 Å to about 1000 Å in thickness.

30. The method of claim 26 wherein the active layer is about 25 Å to about 400 Å in thickness.

31. The method of claim 26 wherein the step of oxidizing results in an oxidation layer about 25 Å to about 800 Å in thickness.

32. The method of claim 26 wherein the step of applying a mask layer includes applying a photoresist mask on the mask layer.

33. The method of claim 26 further comprising removing the mask layer after etching the active layer.

34. The method of claim 26 wherein the active layer is formed from a material selected from the group consisting of silicon, germanium, silicon-germanium, and combinations thereof.

35. The method of claim 26 wherein the step of oxidizing is performed with an ambient content comprising $O_2$, $H_2O$, NO, or some combination thereof.

36. The method of claim 26 wherein the step of oxidizing is performed by one or more steps of annealing by a furnace anneal or a rapid thermal anneal process at a temperature about 500° C. to about 1250° C.

* * * * *

UNITED STATES PATENT AND TRADEMARK OFFICE
CERTIFICATE OF CORRECTION

PATENT NO. : 7,316,979 B2
APPLICATION NO. : 10/632570
DATED : January 8, 2008
INVENTOR(S) : Liaw Page 1 of 1

It is certified that error appears in the above-identified patent and that said Letters Patent is hereby corrected as shown below:

On the Title Page, Section (56) References Cited, U.S. PATENT DOCUMENTS, column 2, after 1ˢᵗ entry, insert --6,794,269 B1* 9/2004 Gopalan et al. ...........438/427--.
In Col. 5, line 18, delete "Åto" and insert --Å to--.

Signed and Sealed this

Twentieth Day of May, 2008

JON W. DUDAS
*Director of the United States Patent and Trademark Office*